(12) United States Patent
Tanie

(10) Patent No.: US 7,239,010 B2
(45) Date of Patent: Jul. 3, 2007

(54) SEMICONDUCTOR DEVICE

(75) Inventor: Hisashi Tanie, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 53 days.

(21) Appl. No.: 11/043,256

(22) Filed: Jan. 25, 2005

(65) Prior Publication Data
US 2005/0212104 A1  Sep. 29, 2005

(30) Foreign Application Priority Data
Mar. 23, 2004  (JP)  ............................. 2004-083788

(51) Int. Cl.
*H01L 23/495* (2006.01)
(52) U.S. Cl. .................. 257/676; 257/678; 257/778; 257/780; 257/728; 257/730
(58) Field of Classification Search ................ 257/675, 257/678, 728–730, 778, 780, 676
See application file for complete search history.

(56) References Cited
U.S. PATENT DOCUMENTS
6,437,990 B1 *  8/2002  Degani et al. .............. 361/783
6,627,997 B1 *  9/2003  Eguchi et al. .............. 257/777

FOREIGN PATENT DOCUMENTS
JP  08-181228  7/1996
JP  09-097855  4/1997

* cited by examiner

Primary Examiner—Sara Crane
Assistant Examiner—Junghwa Im
(74) Attorney, Agent, or Firm—Townsend and Townsend and Crew LLP

(57) ABSTRACT

By securing a fatigue life of a connection portion with a semiconductor package and a mount board, a semiconductor device having a high reliability is provided.

The semiconductor device consists of a semiconductor element, a mount board in which said semiconductor element is mounted, and a support member in which said mount board is supported through a connection member, wherein the connection member consists of a first mount board connection portion with the mount board at a first side of the element in a direction along a main surface of the mount board in which the semiconductor element is mounted, and consists of a first support member connection portion with the support member at a second side in opposition to the first side through the semiconductor element.

8 Claims, 8 Drawing Sheets (A) MOUNT BOARD TOP VIEW (B) CASE TOP VIEW (C) MOUNTING STATE TOP VIEW (D) MOUNTING STATE SIDE VIEW (A) MOUNT BOARD TOP VIEW (B) CASE TOP VIEW (C) MOUNTING STATE TOP VIEW (D) MOUNTING STATE SIDE VIEW

SEMICONDUCTOR DEVICE

BACKGROUND OF THE INVENTION

The present invention relates to a mount technology of a semiconductor package.

PRIOR ART

To enhance a connection reliability for a thermal load of a semiconductor package mounted on a board, JP-A-8-181228 discloses, with respect to a form in which a SAW element is connected to a support board and a cap covering the SAW element is connected to the support board, that the package is arranged by adjusting coefficient of thermal expansion between members in a surface wave transmission direction to control a breaking of wire at a solder portion, and JP-A-9-97855 discloses the form in which a semiconductor chip and a cover covering the chip are installed on a main body and the cover is made of a partially connected structure of metal and ceramics so that a load at the joining area of structural components is controlled.

[Patent Document 1] JP-A-8-181228
[Patent Document 2] JP-A-9-97855

BRIEF SUMMARY OF THE INVENTION

However, according to the forms of the above described documents, it is not sufficient for a simple form to obtain connection reliability between the semiconductor chip and the mount board.

In general, the semiconductor package is mounted on the mount board and used, but comparing to the coefficient of linear thermal expansion of the semiconductor package, the coefficient of linear thermal expansion of the mount board is high. This is because the coefficient of linear thermal expansion of the semiconductor element existing in the interior of a semiconductor package is extremely small comparing to the coefficient of linear thermal expansion of other members, which constitute the semiconductor device. Hence, when the temperatures of the semiconductor package and the mount board change by heat generation, change of environment temperatures, and the like of the semiconductor element at the operation time, there arises a difference in the heat deformation amount of the semiconductor package and the mount board. Although this heat deformation amount is absorbed by the deformation of the connection members such as solder and the like which are arranged between the semiconductor package and the mount board, when the difference of the heat deformation amount is large, a distortion caused in the connection members becomes large, so that it is feared that a fatigue life is shortened and a connection failure occurs. Consequently, the problem here is to prevent the life of the connection members from being shortened and securing the reliability of semiconductor products. Particularly, in case the dimensions of the semiconductor package to be mounted are large, there is a possibility that the reliability of the connection members is reduced. Hence, to mount a semiconductor package larger than conventionally for mass storage and speeding up of the semiconductor device, enhancement of the reliability of the connection members is a particularly important problem.

Hence, the present invention provides a semiconductor device which attempts solution of at least one of the above described problems.

The present invention provides a semiconductor device which attempts solution of at least one of the above described problems. Taking easier measures to meet the problem is preferable in view of enhancing productivity. For example, a semiconductor device which is effectively mounted can be provided.

To solve the above described problems, for example, the thermal deformation amount of the mount board is reduced so as to be drawn near to the thermal deformation amount of the semiconductor package.

For example, a case is provided around the mount board, and the case and the mount board are connected to a connection member, which has a coefficient of linear thermal expansion smaller than the case.

Further, for example, the connection member consists of not less than two members, and each connection member is arranged in a crossed-shape for the mount board and the case.

As a specific example, the semiconductor device is characterized by comprising a semiconductor element, a mount board in which the semiconductor element is mounted, and a support member in which the mount board is supported through the connection member, wherein the connection member consists of a first mount board connection portion with the mount board at a first side of the element in a direction along a main surface of the mount board in which the semiconductor element is mounted, and consists of a first support member connection portion with the support member at a second side in opposition to the first side through the semiconductor element.

Further, the semiconductor device is characterized by consisting of a semiconductor element, a mount board in which the semiconductor element is mounted, and a support member in which the mount board is supported by plural connection members, wherein the first connection member consists of a first mount board connection portion with the mount board at a first side of the element in a direction along a main surface of the mount board in which the semiconductor element is mounted, and consists of a first support member connection portion with the support member at a second side in opposition to the first side through the semiconductor element, and wherein the second connection member consists of a second mount board connection portion with the mount board at a second side of the semiconductor element, and consists of a second support member connection portion with the support member at the first side.

By constituting in this way, in case the temperature of the semiconductor device changes by the operation of the semiconductor device and change of environment temperatures, the thermal deformation amount of the mount board can be reduced so as to be drawn near to the thermal deformation amount of the semiconductor package. Further, in this way, the reliability of the connection portion with the semiconductor package and the mount board can be secured. For example, when the semiconductor device rises in temperature so that the case starts thermal expansion, the mount board receives a compression load through the connection member connected to both ends of the mount board. Hence, the thermal deformation amount of the mount board becomes smaller than when the case and the connection member are not available.

Alternately, further, in the present invention, since the case is arranged around the mount board so as to improve heat radiation, the temperature rise at the operating time of the semiconductor device is reduced, thereby enhancing the reliability.

Alternatively, enhancement of the connection reliability between the semiconductor package and the mount board through these effects makes it possible to mount the semiconductor package larger than conventionally on a board with high connection reliability.

In the present invention, as the mount board and the semiconductor package itself, when a structure which is ordinarily used is employed, a change of production process and the like of the mount board and the semiconductor device is controlled, thereby constituting a device comprising high productivity.

By the present invention, the semiconductor device which attempts solution of at least one of the above described problems can be provided.

Other objects, features and advantages of the invention will become apparent from the following description of the embodiments of the invention taken in conjunction with the accompanying drawings.

PREFERRED EMBODIMENTS OF THE INVENTION

FIRST EMBODIMENT

Figure 1:
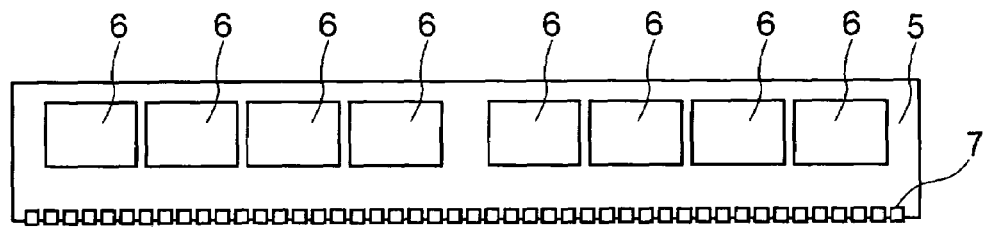
FIG. 1 is a view explaining a first embodiment consisting of the present invention.
Figure 1:
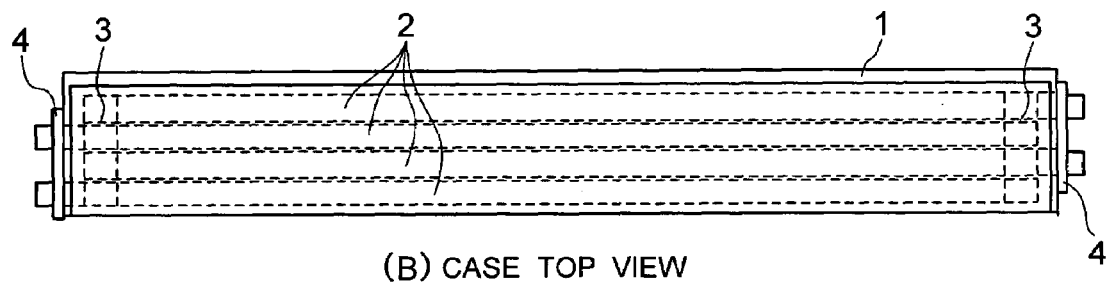
Figure 1:
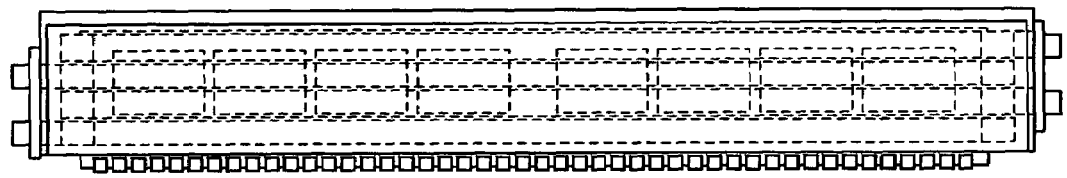
Figure 1:
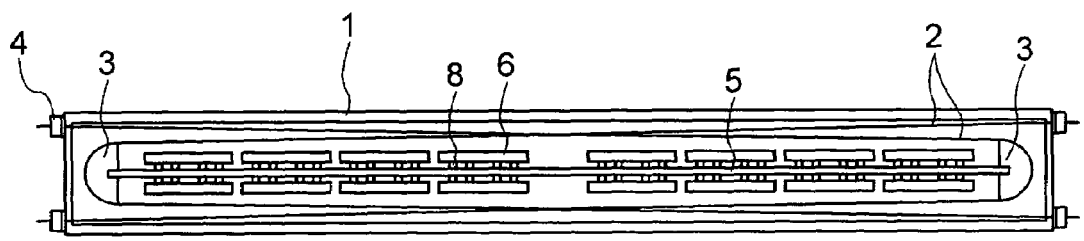

A first embodiment of the present invention will be described below by using the drawings.

In FIGS. 1(A) to 1(D) are shown a top view and a side view of a mounting state of a first embodiment of the present invention, and a top view of a case and a top view of a mount board.

In the present embodiment, the mount board is a glass epoxy board FR-4 having a thickness of about 1 mm. The coefficient of linear thermal expansion of this mount board is about 15 to 20 ppm/° C. Both surfaces of the mount board 5 are provided with the semiconductor packages 6 in a longitudinal direction of plural boards. The longitudinal direction can be taken as a direction where a long side from among main sides constituting the members is formed. One end of the mount board 5 is provided with terminals 7. The terminals 7 are formed along the side of the mount board 5, and when the semiconductor device is operated, for example, the terminals 7 are connected to terminals provided in slots on a mother board so as to take an electrical continuity with the mother board. The semiconductor package 6 and the mount board 5 are connected by a semiconductor package connection portion 8. Similarly to the present embodiment, a solder ball is preferably used for the semiconductor package connection portion 8, but other connection methods such as TSOP and TCP may be also employed. Further, similarly to the present embodiment, plural semiconductor packages 6 are preferably arranged on the mount board 5, but even when the semiconductor package 6 is available only one piece, some effects can be obtained.

The case 1 which is a support member of the mount board 5 is made of Cu alloy in the present embodiment, and the coefficient of linear thermal expansion thereof is about 17 ppm/° C., and the coefficient of thermal conductivity thereof is about 200 W/mk. The case 1 is formed by cutting a plate material and, then, subjecting it to bending. In the interior of the case, there are provided four pieces of a case and board connection member 2. The case and board connection member 2 is made of a material containing a glass fiber. For example, a tape containing a glass fiber having a coefficient of linear thermal expansion of about 5 ppm/° C. is used. From among four pieces of the case and board connection members 2, two pieces of the case and board connection member 2 are connected to a right case side surface and a left side guide 3 in FIG. 1(B), and the other two pieces of the case and board connection member 2 are connected to the left case side surface and a right side guide 3. Each of the case and board connection member 2 is connected to the case in two places of the upper part and the lower part from the mount board 5 in FIG. 1(4). The case can be such a form that it is provided with a hole through which the connection member to connect the mount board 5 and the case can pass through. Further, each case and board connection member 2 fixes a connection portion with the case by using a stopper 4 so that the case and board connection member 2 carry a tensile force.

The mount board 5 and the case 1 are assembled by connecting the guides 3 to both ends of the mount board 5, and through the guides 3, the case and board connection members 2 communicate with the semiconductor package 6. By so doing, the case and board connection members 2 and the semiconductor package 6 are arranged through intervals.

As a preferable form, the point is that the semiconductor device consists of a semiconductor package 6 containing a semiconductor element, a mount board 5 mounted with the semiconductor package 6, and a case 1 which is a support member in which the mount board 5 is supported through a connection member 2, wherein the connection member 2 consists of a first mount board connection portion (for example, a guide 3 portion at one side of the right side and the like) with the mount board 5 at a first side of the package 6 in a direction along a main surface of the mount board 5 mounted with the semiconductor package 6, and consists of a first support member connection portion (for example, a portion connected to the case by the stopper 4) with the case at a second side in opposition to the first side through the semiconductor package 6.

Much preferable is for the semiconductor device to consist of the following form, in which a first connection member consists of a first mount board connection member with the mount board 5 at a first side of the package 6 in a direction along a main surface of the mount board 5 in which the semiconductor package 6 is mounted, and consists of a first support member connection portion with the case at the second side in opposition to the first side through the semiconductor package 6, and a second connection member consists of a second mount board connection portion (for example, a guide portion 3 at the opposite side) with the mount board 5 at a second side of the semiconductor package 6, and consists of a second support member connection portion (for example a portion connected in reverse to the case by a stopper 4) with the case 1 at the first side.

By constituting in this way, in case the temperature of the semiconductor device changes by the operation of the semiconductor device, change of environment temperatures, and the like, the thermal deformation amount of the mount board can be reduced so as to be drawn near to the thermal deformation amount of the semiconductor package. Further, in this way, the reliability of the connection portion with the semiconductor package and the mount board can be secured. For example, when the semiconductor device rises in temperature so that the case starts thermal expansion, the mount board receives a compression load through the connection member connected to both ends of the mount board. Hence, the thermal deformation amount of the mount board becomes smaller than when the case and the connection member are not available.

Alternately, further, in the present invention, since the case is arranged around the mount board so as to improve heat radiation, the temperature rise at the operating time of the semiconductor device is reduced, thereby enhancing the reliability.

Alternatively, enhancement of the connection reliability between the semiconductor package and the mount board through these effects makes it possible to mount the semiconductor package larger than conventionally on the board with high connection reliability.

Further, the connection member for connecting the mount board 5 and the case 1 are available not less than two, and with respect to each of the connection member, a connection place with the mount board 5 and a connection place with the case are oppositely positioned for the center of the mount board 5, and moreover, the form can be such that both sides with respect to the axis are provided with the connection place with the connection member 2 and the mount board 5 for not less than one places.

Alternatively, the form can be such that a distance between the first mount board connection portion and the second support member connection portion or the distance between the second support member connection portion and the first support member connection portion is arranged shorter than the distance between the first mount board connection portion and the first support member connection portion or the distance with the second mount board connection portion or the second support member connection portion.

In case the semiconductor package 6 is mounted in plurality on one main surface of the mount board 5, it is preferable in view of obtaining an action to bring a coefficient of linear thermal expansion difference into play that the mount board connection portion is located at one side and the support member connection portion is located at the other side through the center of the mount board 5 while looking at the direction in which the semiconductor packages 6 are arranged. For example, the mount board connection portion is positioned at the end portion of the one side of the mount board 5, and the support member connection potion is positioned at the end portion of the opposite side through the semiconductor package 6 of the mount board 5.

Alternatively, for example, while looking at a mounting state from a semiconductor element lamination layer, the first connection member is connected to the case at a position upper than the mount board, and is connected to the mount board at a place across the center axis of the mount board from that connection portion, and moreover, is arranged in such a way to be connected to the under part positions of the case and the amount board across the center axis of the mount board.

Next, for example, for the center axis of the mount board, the second connection member and the connection portion of the mount board are provided at the side where the first connection member and the connection portion of the case exist, and the second connection member is arranged in such a way to have a connection portion with the second connection member and the case at two places upper and lower than the mount board at the side where the first connection member and the connection portion of the mount board exist.

Alternatively, for example, by using the connection members connecting at least not less than two mount boards and cases, with respect to each connection member, a connecting place with the mount board and a connecting place with the case are located at opposite sides for the center axis of the mount board, and moreover, the connection members are arranged in such a way to have at least one connecting place with the connection member and the mount board at both side for the center axis of the mount board.

The coefficient of linear thermal expansion of the case 1 is larger than the coefficient of linear thermal expansion of the case and board connection member 2. Hence, in case the semiconductor device rises in temperature, the case 1 expands larger than the case and board connection member 2. Hence, the distance between the guides existing at both ends of the mount board 5 tries to shrink by the difference between the thermal deformation amount with the case 1 and the case and board connection member 2. Actually, since there exists the mount board 5 between the guides 3, the deformation amount of the distance between the guides 3 is smaller than the difference between the thermal deformation amount with the case 1 and the case and board connection member 2, but, by that much, the mount board 5 receives compression load through the guides 3. Although the mount board 5 itself makes a thermal expansion due to rise of temperature, by the compression load acted from the guides 3, the thermal deformation amount of the mount board 5 is further reduced than the case of the mount board itself. As a result, the thermal deformation amount difference between the semiconductor package 6 and the mount board 5 becomes smaller, and the solder connection reliability of the semiconductor package connection portion 8 is enhanced. In case the case and board connection member 2 carries no tensile force and is loosen, no sufficient effect can be obtained. Further, the more the tensile force of the case and board connection member 2 drops in temperature, the more the tensile force becomes small.

Hence, the connection member 2 is formed in such a way to generate a tensile force at least in a conductive state with the semiconductor element of the semiconductor package 6, and in a state where the temperature rises. Alternatively, from among the connection members 2 connecting the mount board 5 and the case 1, not less than two connection members are constructed to carry a tensile force at room temperature.

At least from the view point of a stress, in the present embodiment, it is preferable that the stopper 4 is fixed so as to allow the case and board connection member 2 to carry a tensile force within the range of the operating temperature of the semiconductor device even at least in the lowest temperature.

The stopper 4 is fixed to the case and board connection member 2, and can control a tensile force by adjusting intervals with the case 1. Alternatively, the connection member itself may be attached by carrying a tensile force.

By fixing the stopper 4 in this way, in the entire region of the operating temperature of the semiconductor device, an operating effect can be obtained, and this is effective to enhance the reliability of the solder connection portion 8. In at least a part of the operating temperatures of the semiconductor device, the case and board connection member 2 is formed so as to carry a tensile force, and a slackness is formed to such an extent that a tensile force is small in the temperature lower than that part or a tensile force is not generated, thereby the effect of the present embodiment can be obtained in that temperature region, and at the same time, a very high stress which is applied on a steady basis can be controlled.

In the present constitution, the mount board 5 and the case 1 are not directly connected and fixed, but are fixed through the connection member. Hence, in case an external force such as a static external force, an impact and the like is acted on the case in a mounting state, the case and board connection member 2 can work as a cushioning material. Hence, the external force acting on the mount board 5 is reduced, so that the reliability of the semiconductor device is further enhanced than when the mount board 5 and the case 1 are directly connected.

In the present constitution, by increasing tensile rigidities of the case 1 and the case and board connection member 2 sufficiently higher than the mount board 5, the thermal deformation amount difference between the case 1 and the case and board connection member 2 can be absorbed rather than in a compressed deformation of the mount board, but in an expansion deformation of the case 1 and the case and board connection member 2, so that the effect of the present embodiment can be sufficiently obtained. Further, by making a flexural rigidity of the case 1 higher, the thermal deformation amount difference between the case 1 and the case and board connection member 2 can be prevented from being absorbed by a bending deformation of the case 1, so that the effect of the present embodiment can be sufficiently obtained. Hence, in the present embodiment, the case 1 is allowed to have a thickness of 0.3 mm, and the case and board connection member 2 is allowed to have a thickness of 0.2 mm.

Further, it is preferable that a difference between a longitudinal direction of the semiconductor package 6 and a direction which connects the mount board connection portion of the mount board 5 and the support member connection portion is made so as to become smaller than a difference between a longitudinal direction of the semiconductor package 6 and a direction which connects the mount board connection portion of the mount board 5 and the support member connection portion.

In the present embodiment, since the thermal deformation of the mount board in a direction nipped by the case and board connection member 2 can be reduced, it is effective to mount the semiconductor package 6 in such a way that the direction nipped by the case and board connection member 2 becomes the longitudinal direction of the semiconductor package 6. Hence, in the present embodiment, it is preferable that the longitudinal direction of the mount board 5 which is a direction nipped by the case and board connection member 2 is aligned to the longitudinal direction of the semiconductor package 6.

In the present embodiment, since the mount board 5 is surrounded by the case 1 having a coefficient of thermal conductivity higher than the mount board 5, the heat generated by the semiconductor package 6 can be discharged more effectively than when the case 1 is not available. Hence, the rise in temperature at the operating time of the semiconductor device is controlled, so that a temperature variation width of the connection portion 8 of the semiconductor package is made small, and the reliability of the semiconductor package connection portion 8 can be enhanced. Further, in the present embodiment, though there is an airspace between the semiconductor package 6 and the case 1, by providing a heat pass material in a range not to hinder the movement of the case and board connection member 2, a heat discharging property can be further enhanced.

It is preferable that the above described case is made of Cu, Al or the alloy thereof. In the present embodiment, as one example, a Cu alloy is used for the case 1, but an Al alloy and the like can be also used. In this case, since the coefficient of linear thermal expansion thereof is higher than the Cu alloy and the like, the coefficient of linear thermal expansion difference with the case and board connection member 2 can be made high, but since the coefficient of elasticity thereof becomes small, there is a need to increase the thickness of the case and the like. Further, in the present embodiment, though a tape which contains a glass fiber is used for the case and board connection member 2, a material smaller in coefficient of linear thermal expansion than the case 1 such as Fe—Ni alloy can be also used. In this case, since the flexure rigidity becomes high, a degree of freedom becomes smaller than the case where the tape containing a glass fiber is used for a shape of the guide 3 and a bending shape of the case and board connection member 2. Further, in the present embodiment, though four pieces of member are used for the case and board connection member 2, when at least two members are used to connect the case and board connection member 2 to both sides of the mount board, the effect of the present embodiment can be obtained.

One of the preferable forms to obtain the effect of the present embodiment consists of a semiconductor package 6, a mount board 5 in which the semiconductor package 6 is mounted, and a case 1 in which the mount board 5 is supported by plural connection members 2, wherein the semiconductor package 6 is arranged on both surfaces of the mount board 5 in plurality in a longitudinal direction, and a first connection member consists of a first mount board connection portion with the mount board 5 at a first side of the semiconductor package 6 in a direction where the semiconductor package 6 of the main surface of the mount board 5 is arranged, and consists of a first supporting member connection portion with the case 1 at a second side in opposition to the first side through the semiconductor element, and wherein the second connection member consists of a second mount board connection portion with the mount board 5 at a second side of the semiconductor package 6, and consists of a second support member connection portion with the case 1 at the first side, wherein the first or second connection member 2 is smaller than the case 1 in coefficient of linear thermal expansion.

Figure 2:
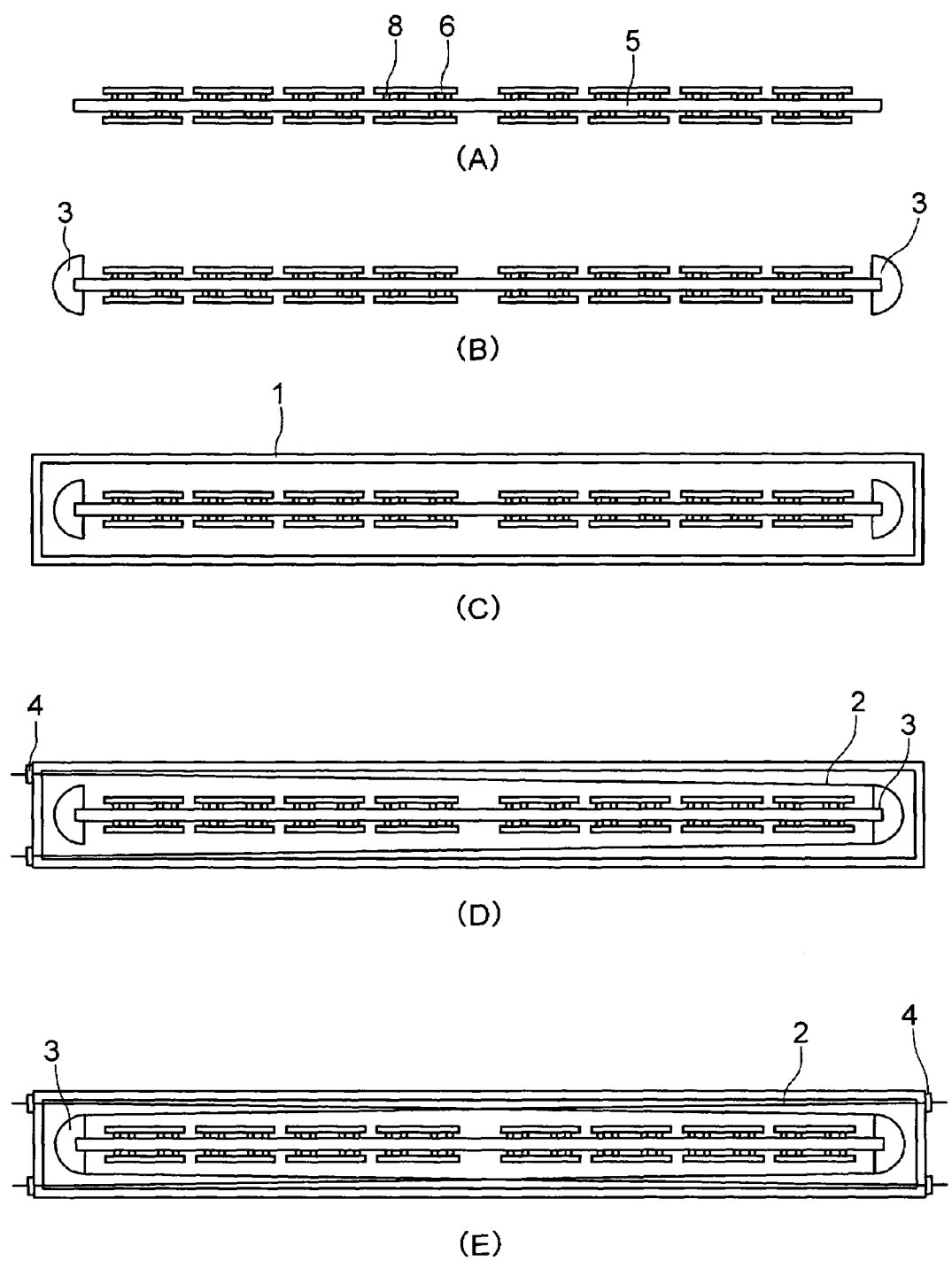
FIG. 2 is a view explaining an assembly method of the first embodiment consisting of the present invention.

In FIG. 2 is shown an assembly method of the first embodiment of the present invention.

In FIG. 2(A) is shown the mount board 5 in which the semiconductor packages 6 are arranged on both side thereof.

The mount board 5 can be taken as the same as a mount board, which does not consist of the present invention. Next, as shown in FIG. 2(B), both ends of the mount board 5 are provided with guides 3. In case a coefficient of elasticity of the guide 3 is small, the thermal deformation amount difference between the case 1 and the case and board connection member 2 ends up being absorbed by the deformation of the guide. Further, in case the coefficient of linear thermal expansion of the guide 3 is smaller than the case and board connection member 2, a compression load acted on the mount board by the thermal deformation difference between the case 1 and the case and board connection member 2 is reduced because a part of the deformation of the guide is absorbed by the thermal deformation of the guide 3. Hence, in the present embodiment, epoxy resin is used for the guide 3. Next, as shown in FIG. 2(C), the mount board 5 is arranged in the interior of the case 1, and as shown in FIG. 2(D), the case and board connection member 2 at one side is arranged so as to be passed through two places of the upper and lower portions of the guide 3 and the case 1 and fastened by a stopper 4 not to have a bending. Finally, the base and board connection member 2 at the side in opposition to FIG. 2(D) is arranged as shown in FIG. 2(E), and the case and board connection members 2 of both sides are fixed so as to carry a tensile force in the lowest minimum temperature of the operation temperature.

As described above, in case the present invention is used, since an assembly process of the semiconductor package 6, an assembly process of the mount board 5, and a reflow process of the mount board 5 can be made the same process as the form ordinarily employed, in view of controlling additional processes and facilities, those processes are preferable. As one of the methods of enhancing the connection reliability of the semiconductor package and the mount board, though there are available the technique and the like of sealing the connection portion by underfill and the like, in case the underfill and the like are used, the process and the facility for sealing are required. Further, instead of using the underfill for the present form, an airspace is formed in the periphery of an electrical communicating portion between the mounted board and the package, so that deterioration of repairing property after the package is mounted on the board can be controlled similarly to the case of using the underfill. However, since the mount form of a mount semiconductor package can be selected from various points of view, this does not hinder the selection of the form provided with the underfill.

The present production process shows one of the manufacturing methods variously conceivable of the embodiment of the present invention, and even if it is a semiconductor module manufactured by another process, if it has characteristics of the present embodiment, needless to mention, some effect will be obtained at any rate.

Figure 3:
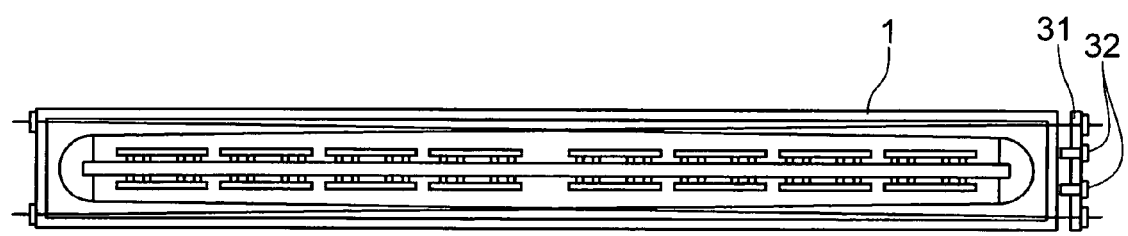
FIG. 3 is a view explaining a second embodiment consisting of the present invention.

In FIG. 3 will be shown a second embodiment of the present invention.

SECOND EMBODIMENT

The present embodiment is the same as the first embodiment except that the side surface of one side of a case 1 is provided with a case and board connection member fixing member 31 and fastening screws 32. In the present embodiment, a case and board connection member 2 of the one side is not directly fixed to the case 1, but fixed to the case and board connection member fixing member 31, and by adjusting a distance between the case and board connection member fixing member 31 and the case 1 by using the fastening screw 32, the adjustment of a tensile force of the case and board connection member 2 is made easy.

Figure 4:
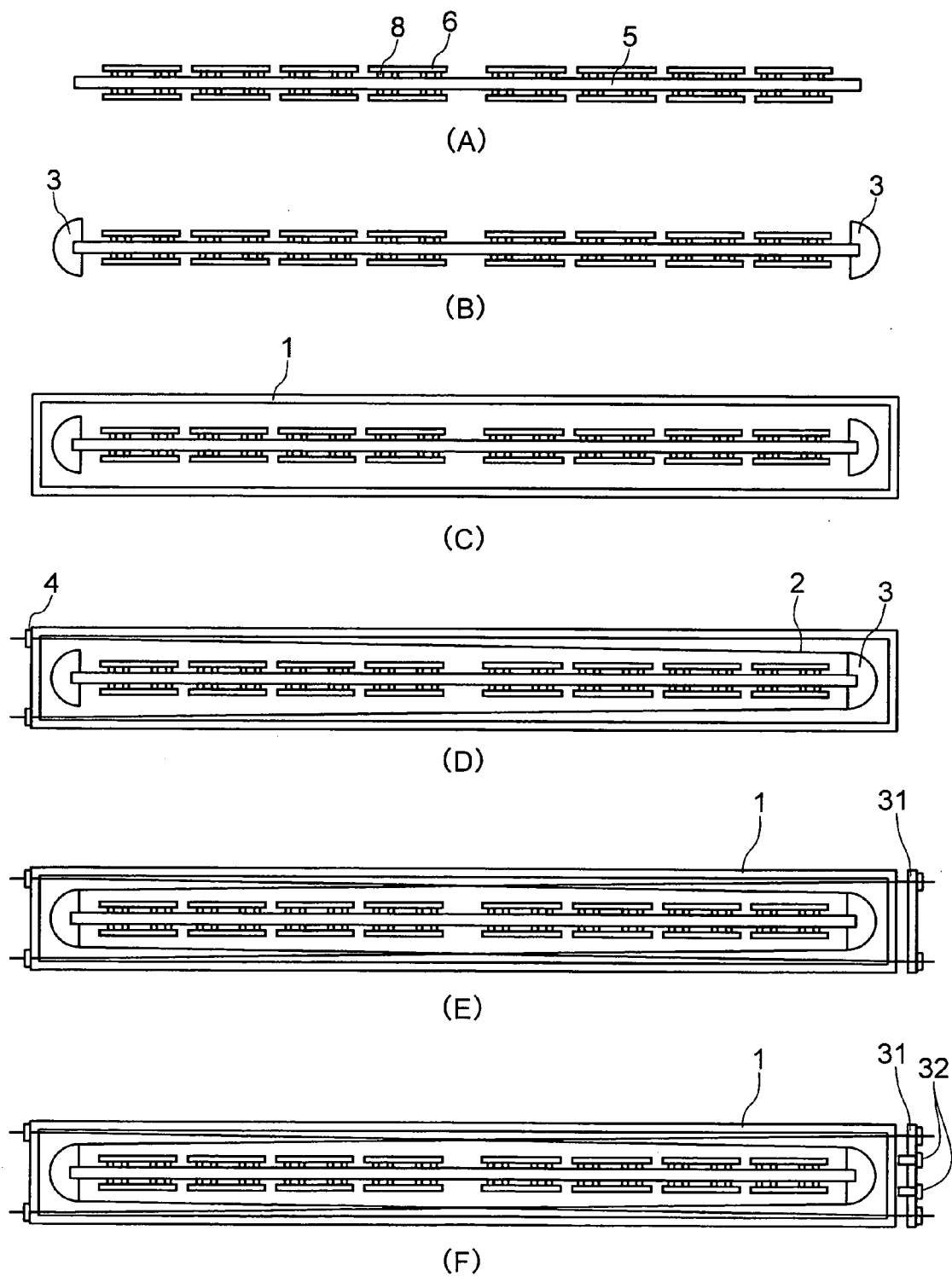
FIG. 4 is a view explaining the assembly method of the second embodiment consisting of the present invention.

In FIG. 4 is shown an assembly method of the second embodiment. FIGS. 4(A) to 4(D) are the same as FIG. 2(A) to 2(D) which show the assembly processes of the first embodiment. In the present embodiment, in FIG. 4(E), the case and board connection member 2 of the one side is fixed to the case and board connection member fixing member 31. At this time, different from the case of FIG. 1(E), there is no need to worry about the bending of the case and board connection member 2. Finally, as shown in FIG. 4(F), the distance of the case and board connection member fixing member 31 and the case 1 is adjusted by using fastening screw 32. By adjusting the distance between the case and board connection member fixing member 31 and the case 1, the tensile forces of both of the case and board connection member 2 arranged at FIG. 4(D) and the case and board connection member 2 arranged at FIG. 4(E) can be adjusted.

While the present embodiment is characterized in that, comparing to the first embodiment, the adjustment of the tensile force of the case and board connection member 2 is easy, the external dimensions of the semiconductor device is increased. Hence, the present embodiment can be used when the mounting position of the semiconductor device has a spatial allowance.

Figure 5:
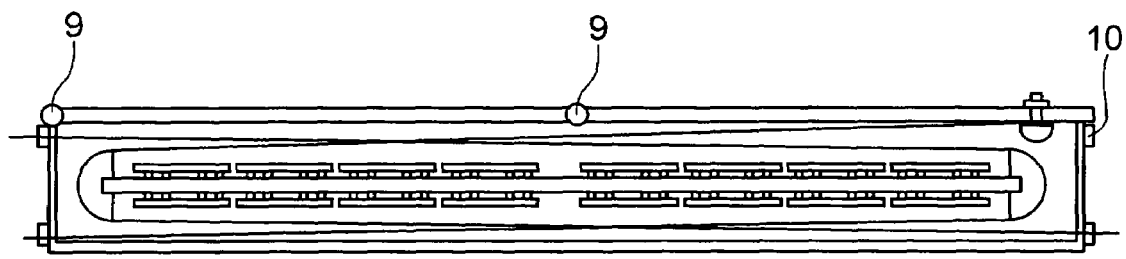
FIG. 5 is a view explaining a third embodiment consisting of the present invention.

In FIG. 5 is shown a third embodiment of the present invention.

THIRD EMBODIMENT

The present embodiment is the same as the first embodiment except that a case 1 has hinges 9 and 9b and a claw 10 to allow a case and board connection member 2 after assembly to carry a tensile force. Since the hinge 9 has its angle fixed after assembly, there is no likelihood of the case 1 bent at a place of the hinge 9 when temperature changes.

Figure 6:
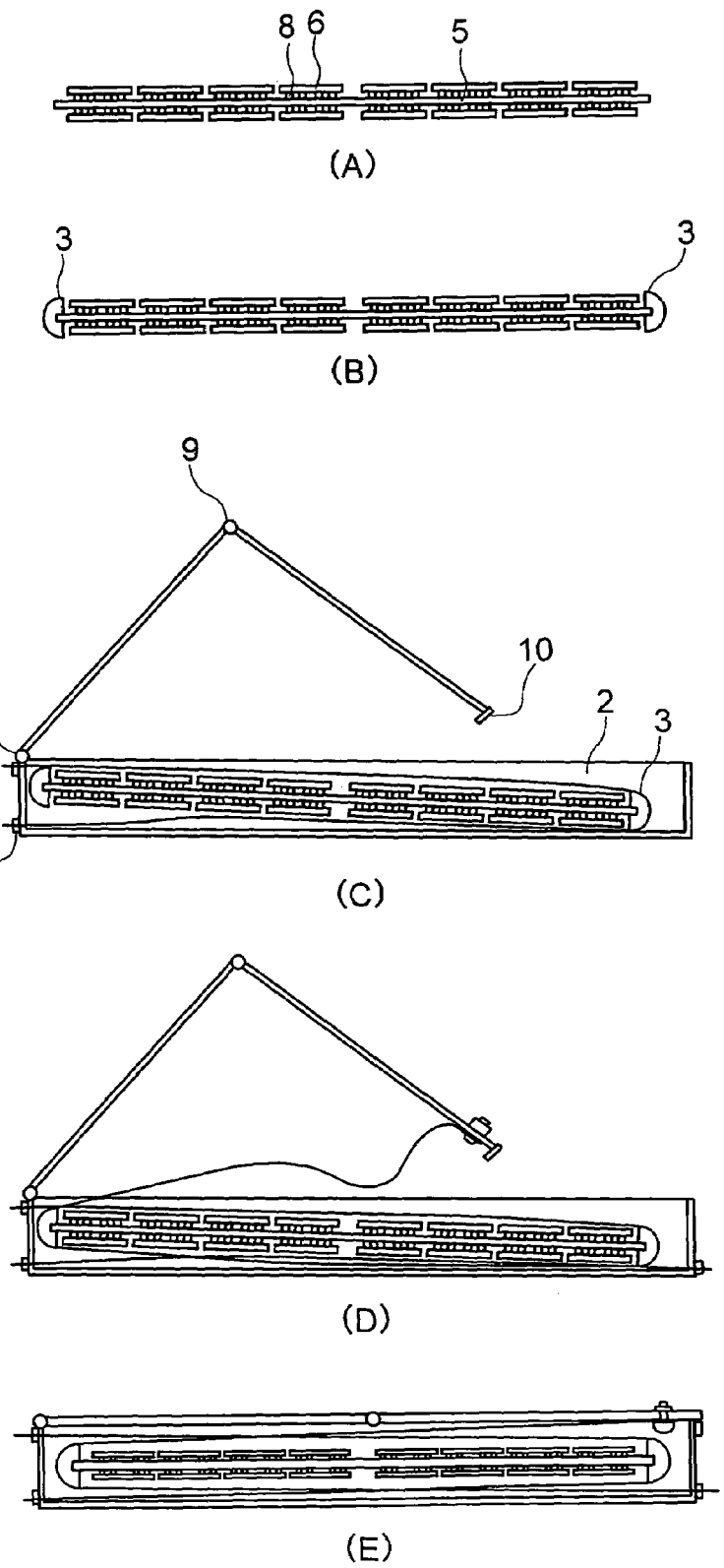
FIG. 6 is a view explaining the assembly method of the third embodiment consisting of the present invention.

In FIG. 6 is shown an assembly method of a third embodiment of the present invention. FIGS. 6(A) and 6(B) are the same as FIGS. 2(A) and 2(B) which show the assembly process of the first embodiment. In FIG. 6(C), the case and board connection member 2 of the one side connected to the case 1 in state where does not fix the angle of the hinge 9 is connected to the guide 3. At this time, similarly to the assembly method of the second embodiment, it does not matter if the case and board connection member 2 has a bending. Next, as shown in FIG. 6(D), the case and board connection member 2 of the other side and the case 1 are connected. At this time also, since the hinges 9 and 9b are in state where the angles thereof are not fixed, the case and board connection member 2 at the one side has a bending caused. At this time, the case and board connection member 2 of the one side is fixed to the case 1 with an appropriate length in such a way to carry a tensile force after assembly. Finally, as shown in FIG. 6(E), the hinge 9 is linearly fixed, and the hinge 9b is fixed to place its angle at 90°, and by using the claw 10, the case 1 is fixed. In this way, since all the case and board connection members 2 after assembly carry a tensile force, and the semiconductor device capable of exerting the effect of the present invention can be realized. Further, different from the first and second embodiments, since the length of the case and board connection member 2 can be adjusted before carrying the tensile force, the adjustment of the length becomes relatively easy.

Figure 7:
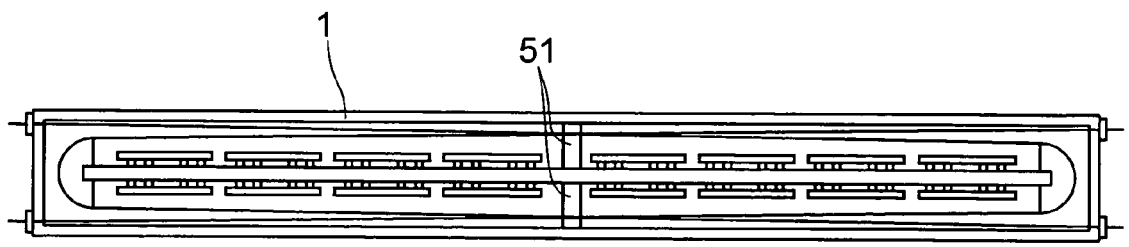
FIG. 7 is a view explaining a fourth embodiment consisting of the present invention.

In FIG. 7 is shown a fourth embodiment of the present invention.

FOURTH EMBODIMENT

In the present embodiment, a case 1 is provided with a warp deformation avoidance member 51. As described above, in case the case 1 has a bending caused by temperature change of the semiconductor device, the effect of the present invention is reduced. Further, in case a mount board 5 is thin or the like, there is a possibility that the mount board 5 has a bending deformation and a buckling because of a compression load acted on the mount board 5. Hence, in the present embodiment, the case 1 is provided with the warp deformation member 51, so that these bending deformation and buckling are avoided. While the present embodiment is provided with one warp deformation avoidance member 51, depending on a length and a thickness of the mount board, it is possible to provide more than two warp deformation avoidance members 51.

Figure 8:
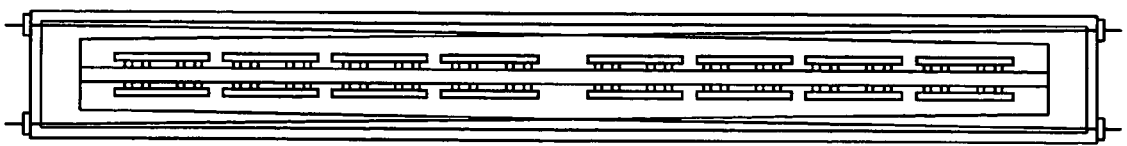
FIG. 8 is a view explaining a fifth embodiment consisting of the present invention.

In FIG. 8 is shown a fifth embodiment of the present invention.

FIFTH EMBODIMENT

In the present embodiment, a case and board connection member 2 contains an alloy of Fe and Ni. For example, a Fe—Ni alloy is used, and a guide 3 is not used. Even when a flexural rigidity of the case and board connection member 2 is high and the guide 3 is not used similarly to the present embodiment, a contact between the case and board connection member 2 and a semiconductor package 6 can be avoided, and moreover, in case the warp deformation of the case and board connection member 2 is small, the guide 3 can be omitted so as to realize a low cost.

Figure 9:
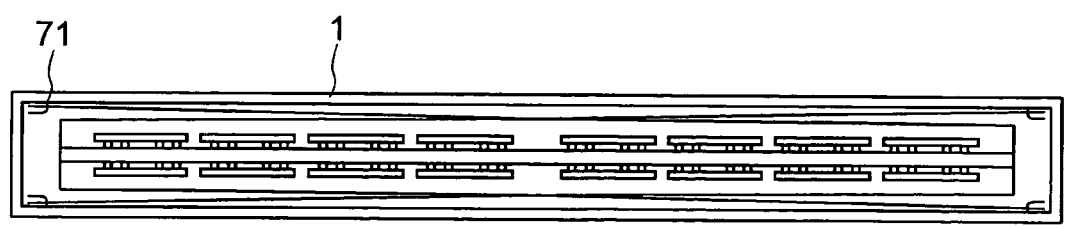
FIG. 9 is a view explaining a six embodiment consisting of the present invention.

In FIG. 9 is shown a sixth embodiment of the present invention.

SIXTH EMBODIMENT

In the present embodiment, a stopper 4 is not used, and a claw 71 provided with the case 1 is fixed to the case and board connection member 2 so as constitute a semiconductor device. When the case and board connection member 2 is fixed to the claw 71 so as to hold a tensile force, the stopper 4 can be omitted, thereby realizing a low cost.

Figure 10:
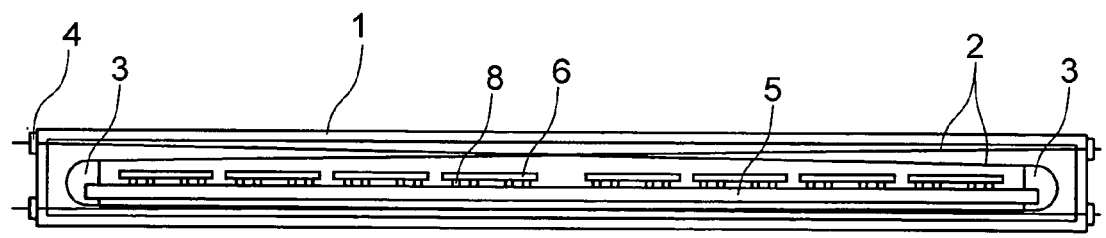
FIG. 10 is a view explaining a seventh embodiment consisting of the present invention.

In FIG. 10 is shown a seventh embodiment of the present invention.

SEVENTH EMBODIMENT

In the embodiments described so far, though a semiconductor package 6 is mounted on both sides of a mount board 5, even in case the semiconductor package 6 is mounted only on one side of the mount board similarly to the present embodiment, by arranging a case 1 and a case and board connection member 2 similarly to the embodiments described so far, the effect of the present invention can be obtained.

In the first to the seventh embodiments described so far, the case and board connection member 2 and the mount board 5 are connected to a longitudinal direction end portion of the mount board 5 through the guide 3. In this case, the direction in which the thermal deformation can be reduced is a board longitudinal direction only, and by the portion in which the board longitudinal direction is compressed, the deformation in a board traverse direction is slightly increased due to the influence of Poisson's ratio. In the embodiments described so far, since terminals 7 are lined up and arranged in a longitudinal direction of the mount board 5, it is difficult to provide the guide 3 in a board traverse direction end portion, but in case an electrical continuity with the mount board 5 and the outside is established by a connector, a lead wire and the like arranged closer to a mount board center than a mount board end portion, the guides 3 are provided at both sides respectively in the longitudinal and the traverse directions of the mount board, and each guide 3 is connected to the case 1 through the case and board connection member 2, so that the thermal deformation in both of the mount board longitudinal and traverse directions can be reduced. In this case, by changing a height of the guide 3b from the mount board in both of the mount board longitudinal and traverse directions, the height from the mount board of the case and board connection member 2 for reducing the thermal deformation in the mount board longitudinal direction and the case and board connection member 2 for reducing the thermal deformation in the mount board traverse direction can be changed, so that each case and board connection member 2 can be prevented from colliding each other to restrict its movement.

Figure 11:
FIG. 11 is a view explaining a ninth embodiment consisting of the present invention.

In FIG. 11 is shown a ninth embodiment of the present invention.

NINTH EMBODIMENT

In case a heat value of a semiconductor package 6 mounted in a semiconductor device is small and there is no need to use a case 1 for the semiconductor device due to an excellent cooling condition of the mounted position and the like, guides arranged at both ends of the mount board 5 are connected by a guide and guide connection member 11, so that the thermal deformation of the mount board 5 can be reduced. However, in this case, a material used for the guide and guide connection member 11 is required to be smaller than the mount board 5 in coefficient of linear thermal expansion similarly to a tape containing a glass fiber, a Fe—Ni alloy and the like. Further, in the present embodiment, by using a thermal deformation amount difference between the guide and guide connection member 11 and the amount board 5, the thermal deformation of the amount board 5 is reduced. In the present embodiment, since the case 1 is not available, different from other embodiments, the thermal deformation of the case 1 cannot be used for reducing the thermal deformation of the mount board 5. In the meantime, different from other embodiments, the present embodiment is characterized in that there is no need to arrange the case and board connection member 2 in a crossed shape, and for example, since the present embodiment can be constructed by winding the tape containing a glass fiber around the mount board 5, the production process can be made simpler than other embodiments.

While the present invention has been specifically described based on the embodiments, the invention is not limited to those embodiments, and naturally, the invention can be modified variously without departing from the spirit of the invention.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device, comprising:
    a semiconductor element;
    a mount board in which said semiconductor element is mounted; and
    a support member in which said mount board is supported through a connection member;
    wherein said connection member comprises a first mount board connection portion with said mount board at a first side of said semiconductor element in a direction along a main surface of said mount board in which said semiconductor element is mounted, and comprises a first support member connection portion with said support member at a second side in opposition to said first side through said semiconductor element, wherein said semiconductor element is mounted in plurality, and with respect to the direction in which said semiconductor elements are arranged, said mount board connection portion is positioned at the one side through a center of the mount board, and said support member connection portion is positioned at the other side.

2. A semiconductor device, comprising:

a semiconductor element;

a mount board in which said semiconductor element is mounted; and a support member in which said mount board is supported by plural connection members;

wherein a first connection member comprises a first mount board connection portion with said mount board at a first side of said semiconductor element in a direction along a main surface of said mount board in which said semiconductor element is mounted, and comprises a first support member connection portion with said support member at a second side in opposition to said first side through said semiconductor element, and wherein a second connection member comprises a second mount board connection portion with said mount board at the second side of said semiconductor element, and comprises a second support member connection portion with said support member at said first side.

3. The semiconductor device according to claim 1, wherein said connection member is a member larger than said support member in coefficient of liner thermal expansion.

4. The semiconductor device according to claim 1, wherein said mount board connection portion is positioned at the end portion of said mount board, and said support member connection portion is positioned at the end portion side of the opposite side through said semiconductor element of said mount board.

5. The semiconductor device according to claim 2, wherein a distance between said first mount board connection portion and said second support member connection portion or a distance between said second support member connection portion and said first support member connection portion is arranged shorter than a distance between said first mount board connection portion and said first support member connection portion or a distance between said second mount board connection member and said second support member connection member.

6. The semiconductor device according to claim 1, wherein said connection member is formed so as to generate a tensile force within the range of a regulated operation temperature of the semiconductor element.

7. The semiconductor device according to claim 1, wherein plural semiconductor elements are mounted on both sides of said mount board.

8. A semiconductor device, comprising:

a semiconductor element;

a mount board in which said semiconductor element is mounted; and a support member in which said mount board is supported by plural connection members;

wherein said semiconductor element is arranged in plurality on both sides of said mount board in a longitudinal direction, and wherein a first connection member comprises a first mount board connection portion with said mount board at a first side of said semiconductor element in a direction to which said semiconductor element of the main surface of said mount board is arranged, and comprises a first support member connection portion with said support member at a second side in opposition to said first side through said semiconductor element, wherein a second connection member comprises a second mount board connection portion with said mount board at the second side of said semiconductor element, and comprises a second support member connection portion with said support member at said first side, and wherein said first or second connection member is smaller than said support member in coefficient of linear thermal expansion.

* * * * *